(12) United States Patent
Galazka et al.

(10) Patent No.: US 11,028,501 B2
(45) Date of Patent: Jun. 8, 2021

(54) METHOD FOR GROWING β PHASE OF GALLIUM OXIDE ([β]-GA2O3) SINGLE CRYSTALS FROM THE MELT CONTAINED WITHIN A METAL CRUCIBLE

(71) Applicant: FORSCHUNGSVERBUND BERLIN E.V., Berlin (DE)

(72) Inventors: Zbigniew Galazka, Berlin (DE); Reinhard Uecker, Eggersdorf (DE); Detlef Klimm, Eichwalde (DE); Matthias Bickermann, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 118 days.

(21) Appl. No.: 15/541,764

(22) PCT Filed: Dec. 16, 2015

(86) PCT No.: PCT/EP2015/079938
§ 371 (c)(1),
(2) Date: Jul. 6, 2017

(87) PCT Pub. No.: WO2016/110385
PCT Pub. Date: Jul. 14, 2016

(65) Prior Publication Data
US 2017/0362738 A1    Dec. 21, 2017

(30) Foreign Application Priority Data
Jan. 9, 2015   (EP) ..................................... 15150582

(51) Int. Cl.
C30B 29/16    (2006.01)
C30B 11/00    (2006.01)
(Continued)

(52) U.S. Cl.
CPC ............ C30B 29/16 (2013.01); C30B 11/005 (2013.01); C30B 11/006 (2013.01); C30B 15/08 (2013.01);
(Continued)

(58) Field of Classification Search
CPC ......... C30B 29/16; C30B 17/00; C30B 15/34; C30B 11/005; C30B 15/08; C30B 11/006; C30B 15/20
See application file for complete search history.

(56) References Cited

U.S. PATENT DOCUMENTS 4,444,728 A * 4/1984 Lanam .................. C03B 5/1675
                                                    420/461
4,534,821 A * 8/1985 Sakaguchi .............. C30B 15/00
                                                    117/35
(Continued)

OTHER PUBLICATIONS

International Search Report and Written Opinion, dated Feb. 16, 2016, in International Patent Application No. PCT/EP2015/079938.
(Continued)

*Primary Examiner* — Matthew J Song
(74) *Attorney, Agent, or Firm* — Wood, Phillips, Katz, Clark & Mortimer

(57) ABSTRACT

A method for growing beta phase of gallium oxide (β-$Ga_2O_3$) single crystals from the melt contained within a metal crucible surrounded by a thermal insulation and heated by a heater. A growth atmosphere provided into a growth furnace has a variable oxygen concentration or partial pressure in such a way that the oxygen concentration reaches a growth oxygen concentration value (C2, C2', C2") in the concentration range (SC) of 5-100 vol. % below the melting temperature (MT) of $Ga_2O_3$ or at the melting temperature (MT) or after complete melting of the $Ga_2O_3$ starting material adapted to minimize creation of metallic gallium amount and thus eutectic formation with the metal
(Continued)

crucible. During the crystal growth step of the β-Ga$_2$O$_3$ single crystal from the melt at the growth temperature (GT) the growth oxygen concentration value (C2, C2', C2") is maintained within the oxygen concentration range (SC).

15 Claims, 5 Drawing Sheets

(51) Int. Cl.
*C30B 15/08* (2006.01)
*C30B 15/34* (2006.01)
*C30B 17/00* (2006.01)
*C30B 15/20* (2006.01)

(52) U.S. Cl.
CPC ............. *C30B 15/20* (2013.01); *C30B 15/34* (2013.01); *C30B 17/00* (2013.01)

(56) References Cited

U.S. PATENT DOCUMENTS

| | | | | |
|---|---|---|---|---|
| 6,997,986 B2* | 2/2006 | Sato | ........................ | C30B 15/00 117/13 |
| 2004/0007708 A1* | 1/2004 | Ichinose | ................. | C30B 15/00 257/79 |
| 2006/0150891 A1* | 7/2006 | Ichinose | ................. | C30B 23/02 117/2 |
| 2008/0081013 A1* | 4/2008 | Fududa | ................... | C30B 15/00 423/263 |
| 2011/0253031 A1* | 10/2011 | Shonai | .................... | C30B 15/28 117/35 |
| 2014/0217554 A1* | 8/2014 | Sasaki | ................... | H01L 29/872 257/616 |
| 2015/0353822 A1* | 12/2015 | Tyagi | ................. | C09K 11/7774 250/362 |

OTHER PUBLICATIONS

Víllora Encarnación et al: "Epitaxial relationship between wurtzite GaN and [beta]-Ga2O3", Applied Physics Letters, American Institute of Physics, US vol. 90, No. 23, Jun. 4, 2007.

Zbigniew Galazka et al.: "On the bulk [beta]-Ga2O3 single crystals grown by the Czochralski method", Journal of Crystal Growth, vol. 404, pp. 184-191, Oct. 1, 2014, Elsevier, NL.

Morteza Asadian: "The Influence of Atmosphere on Oxides Crystal Growth", Modern Aspects of Bulk Crystal and Thin Film Preparation, Jan. 13, 2012, InTech, Croatia.

Asadian M et al: "Improvement of Nd:GGG crystal growth process under dynamic atmosphere composition", Solid State Sciences, vol. 14, No. 2, Jan. 13, 2012, Elsevier, NL.

Tomm Y et al: "Czochralski grown Ga2O3 crystals", Journal of Crystal Growth, Elsevier, Amsterdam, NL, vol. 220, No. 4, Dec. 1, 2000.

Z. Galazka et al: "Czochralski growth and characterization of [beta]-Ga2O3 single crystals", Crystal Research and Technology, vol. 45, No. 12, Aug. 26, 2010, Wiley-VCH, Weinheim.

\* cited by examiner

METHOD FOR GROWING β PHASE OF GALLIUM OXIDE ([β]-GA2O3) SINGLE CRYSTALS FROM THE MELT CONTAINED WITHIN A METAL CRUCIBLE

BACKGROUND OF THE INVENTION

Field of the Invention

The present invention relates in general to a method for growing oxide single crystals from the melt contained within a metal crucible and in particular for growing beta phase of gallium oxide (β-$Ga_2O_3$) single crystals from the melt contained within the metal crucible.

Background Art

Beta phase of gallium oxide (β-$Ga_2O_3$) belongs to the group of transparent semiconducting oxides. It is a semiconductor with a wide optical bandgap of 4.8 eV, what makes it transparent in the visible down to deep ultraviolet spectrum (DUV). Such unique properties offer opportunities for developing a number of applications in the field of electronics (e.g. field effect transistors) and optoelectronics (e.g. light emitting diodes), and environmental monitoring (e.g. gas sensors). For most of such applications bulk single crystals are required, from which electronic or optoelectronic components or substrates for thin film depositions could be prepared.

For industrial applications large single crystals of high quality are demanded. In the case of oxide single crystals they are typically grown from the melt contained within a metal crucible, e.g. comprising platinum for low and moderate melting points (below 1500° C.), iridium for high melting points (roughly between 1500-2200° C.) and molybdenum, tungsten or rhenium for very high melting point oxides (above 2200° C.). There are several crystal growth techniques operating with the use of the metal crucible, including the Czochralski method, Kyropolous method, Vertical or Horizontal Bridgman method, Vertical Gradient Freeze method, shaped crystal growth methods, such as the Stepanov, Noncapillary Shaping (NCS) and Edge-Defined Film-Fed Growth (EFG) methods and Levitation Assisted Self-Seeding Crystal Growth method (LASSCGM).

Gallium oxide is thermodynamically unstable at high temperatures, what in combination with high melting point (about 1820° C.) leads to a strong decomposition. To stabilize this compound high oxygen partial pressure (or concentration) is required. However, this creates additional difficulties since iridium or iridium alloy crucible must be used, which has a tendency to a strong oxidation at low and moderate temperatures in particular, although small oxygen concentration can be used (typically maximum 2%). Other metal crucibles cannot withstand even very small oxygen concentrations, while platinum has too low melting point to be used for gallium oxide.

High oxygen concentration for growing β-$Ga_2O_3$ single crystals can be applied for those growth methods, which operate on a crucible-free basis. An example of such method applied for β-$Ga_2O_3$ single crystals is the Optical Floating Zone (OFZ) method, e.g. as described in the publications by Ueda et al., Appl. Phys. Lett. 70 (1997) 3561, Appl. Phys. Lett. 71 (1997) 933, Tomm et al., Sol. Cells 66 (2000) 369, Villora et al., J. Cryst. Growth 270 (2004) 420, Appl. Phys. Lett, 92 (2008) 202120 and U.S. Pat. No. 8,747,553 B2. In this method a very small portion of the $Ga_2O_3$ feed rod is molten by a light beam focused on a tip of the feed rod. The molten portion of the feed rod is contacted with a seed, on which a crystal is grown during translation of the seed with respect to the light beam. Due to a very small molten area of the feed rod (very small cross section area of the light beam) the resulted crystal diameter is also small, typically not exceeding 5-6 mm. Although larger crystal (about 25 mm in diameter) was demonstrated, this seems to be a limit for the crystal size, whose quality is highly deteriorated due inhomogeneity of temperature gradients across the liquid-solid growth interface as the result of very small cross section are of the light beam with respect to a cross section of the growth interface. So far, the OFZ method has not found any industrial applications for oxide crystals, due to too small crystal volume.

Another crucible-less method applied to β-$Ga_2O_3$ crystals is the Verneuil method described by Chase, J. Am. Ceram. Soc. 47 (1964) 470. Here, the powdered starting material of $Ga_2O_3$ is molten with $H_2$—$O_2$ flames and the liquid drops fall down on a seed and solidify to form a crystal. Due to poor structural quality and small crystal size, this method has not found continuation in the research of β-$Ga_2O_3$ growth.

β-$Ga_2O_3$ single crystals were already grown from melt contained in an iridium crucible with the use of the Czochralski method as described in the publications by Tomm et al., J. Cryst. Growth 220 (2000) 510 and Galazka et al., Cryst. Res. Technol. 45 (2010) 1229 and Galazka et al. J. Cryst. Growth 404 (2014) 184. In the Czochralski method the crystal is pulled out directly from an exposed melt surface contained within the iridium crucible. In both cases a dynamic self-adjusting growth atmosphere containing CO2 was used. CO2 decomposes with temperature and releases more oxygen as temperature increases. In this way about 1.2 vol. % of oxygen can be provided at melting point of Ga2O3 with no harm to the iridium crucible, because at low and moderate temperatures, where iridium oxidizes the most, oxygen concentration is kept at a very low level. Yet more oxygen (up to 4%) was provided by applying an overpressure of CO2 at the level of several bar. The oxygen concentration provided by CO2 is sufficient to grow cylindrical β-Ga2O3 single crystals with diameter of about 20-22 mm from the iridium crucible of 40 mm in diameter.

Another method applied to grow β-$Ga_2O_3$ single crystals from the melt contained in an iridium crucible is the EFG method, as described in the publication to Aida et al., Jpn. J. Appl. Phys. 47 (2008) 8506 and patent application documents JP 2013082587 A, JP 2013103863 A, JP 2013124216 A, JP 2013227160 A, JP 2013237591 A, JP 2013241316 A, WO 2013073497 A1 and WO 2014073314A1. In this method an iridium die is provided in the iridium crucible, which has small openings and a slit on the top that communicates with the openings. The melt is transported through the die by capillary forces to the top slit, from which a crystal sheet is pulled out from the die. The melt surface area and the melt volume in the die slit are typically small, therefore small oxygen concentration is likely sufficient for the stable crystal growth, although these documents do not refer to any oxygen concentration when using iridium components. The crystal sheets may have a relatively large longitudinal cross-section, but typically small thickness (such as a few millimeters) what limits the total crystal volume being a crucial aspect for industrial applications.

To grow larger crystals, such as over 1 kg by weight (e.g. 2 inch in diameter and 4-5 inch long in the case of the Czochralski method), large crucibles must be used. This means much larger exposed melt surface which is in a direct contact with a growth atmosphere providing oxygen, much larger crystal volume in which oxygen from the growth atmosphere must be distributed and much larger contact surface area between the liquid $Ga_2O_3$ and iridium crucible. Decomposition of $Ga_2O_3$ produces different species in the gas phase leading to a strong evaporation, but also metallic gallium in the liquid phase (due to oxygen loss). Such liquid metallic gallium is created at the melt surface and in the melt bulk, and changes the melt stoichiometry and temperature, therefore growing a crystal from such affected melt surface is practically impossible. Even if the beginning of the growth is successful, metallic gallium forms a film on the crystal surface, which blocks heat transfer through the growing crystal, what in turn induces growth instabilities decreasing a usable crystal volume. Metallic gallium particles that attach to the crystal surface and built in the crystal lattice significantly deteriorates the crystal quality, which may not be usable for most of the applications. Moreover, metallic gallium transported within the melt via convection flows reacts with solid iridium crucible (and the die in the case of the case of the shaped techniques) and form eutectic leading to a severe crucible damage and consequently high economical losses. Eutectic formation highly increases with increasing the melt volume and crucible size. These negative effects limit the growth of large $\beta$-$Ga_2O_3$ single crystals in terms of a reasonable volume, crystal quality, growth stability and iridium crucible life time, which all define the production yield and costs.

Zbigniew Galazka et al.: "On the bulk [beta]-Ga2O3 single crystals grown by the Czochralski method", Journal of Crystal Growth, vol. 404, 1 October 2014 (2014-10-01) pages 184-191, discloses the growth of $\beta$-$Ga_2O_3$ single crystals by the Czochralski method with the use of a $CO_2$-containing growth atmosphere, which provides at melting point of $Ga_2O_3$ the oxygen concentration not higher than 4 vol. %.

Morteza Asadian: "The influence of Atmosphere on Oxides Crystal Growth" in "Modern Aspects of Bulk Crystal and Thin Film Preparation", (2012-01-13), Intech, is a purely theoretical work that incorporates experimental results from the published papers, which are well known to those skilled in the art. The main focus of this document is to minimize the oxidation of iridium at low and moderate temperatures and provide higher oxygen concentration at high temperatures to minimize the evaporation as the result of the decomposition.

SUMMARY OF THE INVENTION

An object of the present invention is to provide conditions for growing $\beta$-$Ga_2O_3$ single crystals from the melt, which minimize $Ga_2O_3$ decomposition and eliminate a damage of a metal crucible as the result of metallic gallium formation forming eutectic with iridium.

Another object of the present invention is to provide conditions for growing $\beta$-$Ga_2O_3$ single crystals from the melt, which ensure a stable crystal growth process.

Yet another object of the present invention is to provide high quality $\beta$-$Ga_2O_3$ single crystals, which would meet requirements for electronic and optoelectronic applications, including substrates for epitaxy.

Still another object of the present invention is to provide conditions for growing $\beta$-$Ga_2O_3$ single crystals from the melt by different growth techniques utilizing a metal crucible.

Further object of the present invention is to provide a method for growing $\beta$-$Ga_2O_3$ single crystals from the melt contained within a metal crucible, which would enable for obtaining large crystals of at least 0.5 kg, in particular much over 1 kg.

In a more general aspect, a yet further object of the present invention is to provide a method for growing other oxide compounds, which are thermally unstable at high temperatures, in particular other transparent semiconducting oxides, such as, but not limited to ZnO, $In_2O_3$, NiO, $SnO_2$, $BaSnO_3$ and like.

According to the first aspect of the invention a method for growing beta phase of gallium oxide ($\beta$-$Ga_2O_3$) single crystals from the melt contained within a metal crucible is provided, which comprises the steps of:

providing into a growth chamber a thermal system or growth furnace comprising the metal crucible containing the $Ga_2O_3$ starting material, a thermal insulation surrounding the metal crucible and a heater disposed around the metal crucible;

providing or creating a crystal seed within the growth furnace;

introducing at least into the growth furnace a growth atmosphere containing oxygen;

heating up the metal crucible by the heater, which in turns heats up the $Ga_2O_3$ starting material until melting;

contacting the crystal seed with the molten $Ga_2O_3$ starting material contained within the metal crucible;

growing a $\beta$-$Ga_2O_3$ single crystal on the crystal seed by temperature gradients between the crystal seed and the melt;

cooling down the grown $\beta$-$Ga_2O_3$ single crystal to room temperature once the crystal growth step has been completed;

wherein the method further comprises the step of i) providing into the growth furnace the growth atmosphere with a variable oxygen concentration or partial pressure in such a way that the oxygen concentration reaches a growth oxygen concentration value in the concentration range of 5-100 vol. % below the melting temperature of $Ga_2O_3$ or at the melting temperature or after complete melting of the $Ga_2O_3$ starting material adapted to minimize creation of metallic gallium amount and thus eutectic formation with the metal crucible and to improve stoichiometry of the $Ga_2O_3$ starting material and crystal growth stability; and ii) maintaining the growth oxygen concentration value within the oxygen concentration range during the crystal growth step of the $\beta$-$Ga_2O_3$ single crystal from the melt at the growth temperature.

In a preferred embodiment of the present invention the oxygen concentration:

iii) does not exceed an intermediate oxygen concentration value in the range of 0-5 vol. % during the heating up step from room temperature to an intermediate temperature value, intermediate temperature value being located within the temperature range between 1000° C. and the melting temperature of $Ga_2O_3$;

iv) increases from the intermediate oxygen concentration value to the growth oxygen concentration value in the concentration range of 5-100 vol. % during the heating up step from the intermediate temperature value to the melting temperature of $Ga_2O_3$ or at the melting temperature or after complete melting of the $Ga_2O_3$ starting material if the intermediate temperature value substantially equals to the melting temperature.

Advantageously, the oxygen concentration:

v) decreases from the growth oxygen concentration value to a final oxygen concentration value being lower than the growth oxygen concentration value during the cooling down step from the growth temperature to room temperature.

Preferably the growth oxygen concentration value is substantially constant within the oxygen concentration range at the growth temperature during the entire crystal growth step. Alternatively, the growth oxygen concentration value decreases to a second oxygen growth concentration value within the oxygen concentration range at the growth temperature after an early stage of the crystal growth step. In further alternative embodiment, the growth oxygen concentration value increases to a third growth oxygen concentration value within the oxygen concentration range at the growth temperature at the later stage of the crystal growth step. In still alternative embodiment, the growth oxygen concentration value first decreases to a second growth oxygen concentration value within the oxygen concentration range at the growth temperature after an early stage of the crystal growth step, and increases to a third growth oxygen concentration value within the oxygen concentration range at the growth temperature at the later stage of the crystal growth step.

In a preferred embodiment of the present invention, the growth atmosphere contains in addition to oxygen at least one of the gases selected from the group consisting of Ar, $N_2$, He, Ne, $CO_2$, CO, $H_2$ and $H_2O$, or any combination thereof.

Advantageously, the growth atmosphere can be applied to the Czochralski method, Kyropolous method, Vertical Bridgman method, Vertical Gradient Freeze method, Horizontal Bridgman method, to shaped crystal growth techniques, such as Stepanov, Noncapillary Shaping and Edge-Defined Film-Fed Growth methods, Levitation Assisted Self-Seeding Crystal Growth method and Micro-Pulling Down method.

According to the second aspect of the invention a bulk $\beta$-$Ga_2O_3$ single crystal is provided, which is obtained by the above-describe method.

According to the third aspect of the present invention a use of bulk $\beta$-$Ga_2O_3$ single crystal is provided, which is in the form of fabricated wafers or substrates for epitaxial films or layers.

The inventors have unexpectedly found out through a series of comprehensive experiments that a very high oxygen concentration can be used in connection with an iridium crucible or its alloys at high temperatures. This discovery is in a high contrast to a common, long-lasting believe being reflected in the literature and experiments, that oxygen concentration should not exceed about 2-5 vol. % in connection with iridium. An essential feature of the present method is to maintain a very high oxygen concentration during crystal growth (5-100 vol. %) from the melt contained within an iridium (or its alloy) crucible, while keeping lower oxygen concentration at lower temperatures during heating up/cooling down steps, when iridium oxidation rate is much higher as compared with high temperatures. Furthermore, partial pressure of iridium oxide at high temperatures is very high so that it simply evaporates and does not contaminate the melt inside the crucible, again, in contrast to high oxygen concentration provided at low and moderate temperatures during heating up, when iridium oxide typically contaminates the melt. Moreover, with high oxygen concentration less oxygen vacancies, twins and grain boundaries are formed in a growing oxide crystal, therefore the crystal quality significantly improves. Most importantly, such growth conditions enable for obtaining large crystals (over 1 kg by weight) what is important from industrial point of view, and also extend life-time of iridium crucibles by elimination of eutectic formation between iridium and metallic gallium typically formed during decomposition process. Additionally, the teaching of the present invention has a general meaning and can be successfully applied to any high-melting point oxides requiring high oxygen partial pressure, including those thereto-chemically unstable ones.

More advantages and other features of the inventive method to growth bulk $\beta$-$Ga_2O_3$ single crystals or other thermally unstable oxide crystals will be apparent from the detailed description of the embodiments in reference to the drawings.

DETAILED DESCRIPTION OF THE PREFERRED EMBODIMENT

Figure 1A:
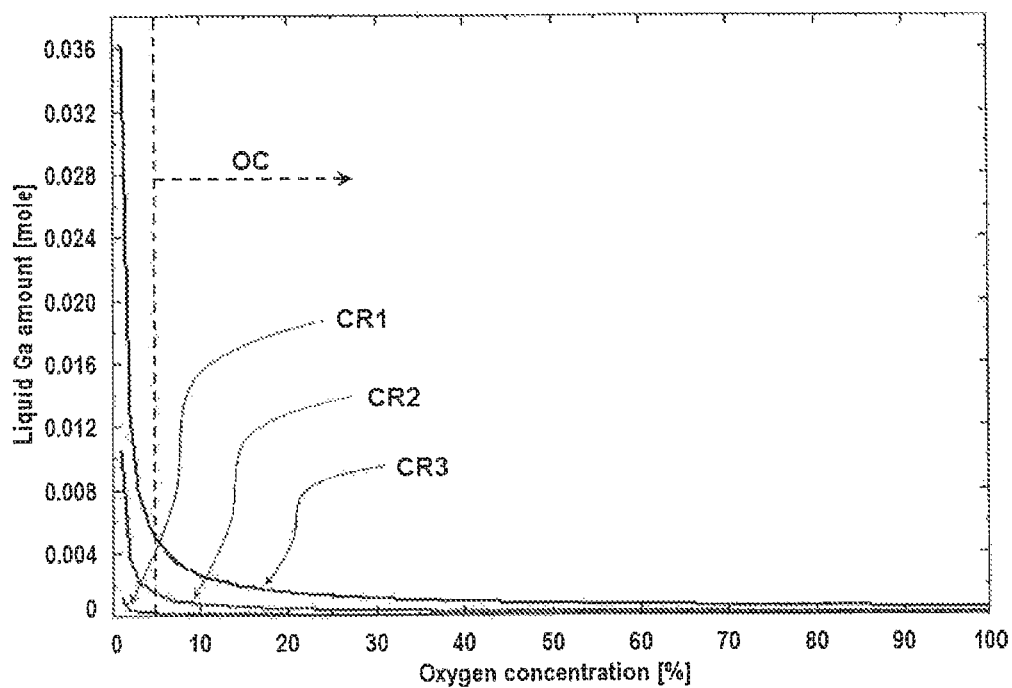
FIGS. 1A and 1B are plots of amount of liquid metallic gallium and gaseous gallium suboxide ($Ga_2O$), respectively, produced during decomposition of $Ga_2O_3$ at its melting temperature.

FIG. 1A shows amount changes of liquid metallic gallium (Ga) in the $Ga_2O_3$ melt (that is at melting point of $Ga_2O_3$ which is 1820° C.) as the result of $Ga_2O_3$ decomposition versus oxygen concentration interacting with the $Ga_2O_3$ melt. The metallic Ga amount CR1 is formed within 2.3 mole of the $Ga_2O_3$ starting material contained within an iridium crucible of 50 mm in diameter and height to grow 1 inch diameter single crystal; the metallic Ga amount CR2 is formed within 18 mole of the $Ga_2O_3$ starting material contained within an iridium crucible of 100 mm in diameter and height to grow 2 inch diameter single crystal, while the metallic Ga amount CR3 is formed within 63 mole of the $Ga_2O_3$ starting material contained within an iridium crucible of 150 mm in diameter and height to grow 3 inch diameter single crystal. Metallic Ga forms with iridium (Ir) eutectic that destroys the crucible containing the $Ga_2O_3$ melt. In addition to liquid metallic Ga also gaseous metallic Ga is formed in the melt, which in areas adjacent to the crucible wall also forms Ga—Ir eutectic. Further, the presence of metallic Ga in the $Ga_2O_3$ melt creates difficulties in growing a $\beta$-$Ga_2O_3$ single crystal and/or obtaining good structural quality thereof, due to changes in melt chemistry and melting temperature. These negative effects, arising from metallic Ga, increases with a melt volume, as higher concentration of metallic Ga is produced. For example, in the case of a growth atmosphere containing 1 vol. % of oxygen the metallic Ga amount CR2 increases with respect to CR1 by factor of about 23, while the metallic Ga amount CR3 increases with respect to CR1 by factor of about 79. Other words, using 1 vol. % of oxygen growing 2 or 3 inch diameter single crystal will result in Ir crucible damage with no possibility to obtain a single crystal. The amount of metallic Ga can be significantly decreased, at least by several times, by increasing the oxygen concentration OC at the level of at least 5 vol. %. In the case of that lowermost value (5 vol. %) the metallic Ga amount CR2 increases with respect to CR1 by factor of only 8, while in the case of metallic Ga amount CR3—by factor of about 27. When considering a decrease of metallic Ga amount when using 5 vol. % of oxygen with respect to 1 vol. % of oxygen, it decreases by factor of 3 and 9 for CR1 and CR2, CR3, respectively. As clearly shown in FIG. 1A, for higher oxygen concentrations in the range 5-100 vol. % the decrease of metallic Ga amount will be more pronounced. Plots CR1, CR2 and CR3 indicate that to minimize the metallic Ga amount a much higher oxygen concentration should be used with an increase of the crystal size to be grown.

Another essential finding of the present invention is that iridium oxide from oxidation of iridium at high temperatures does not contaminate the $Ga_2O_3$ melt and the growing crystal. This is due to a very high partial pressure of iridium oxide at high temperatures, which simply evaporate to the environment immediately after creation at the crucible wall.

Figure 1B:
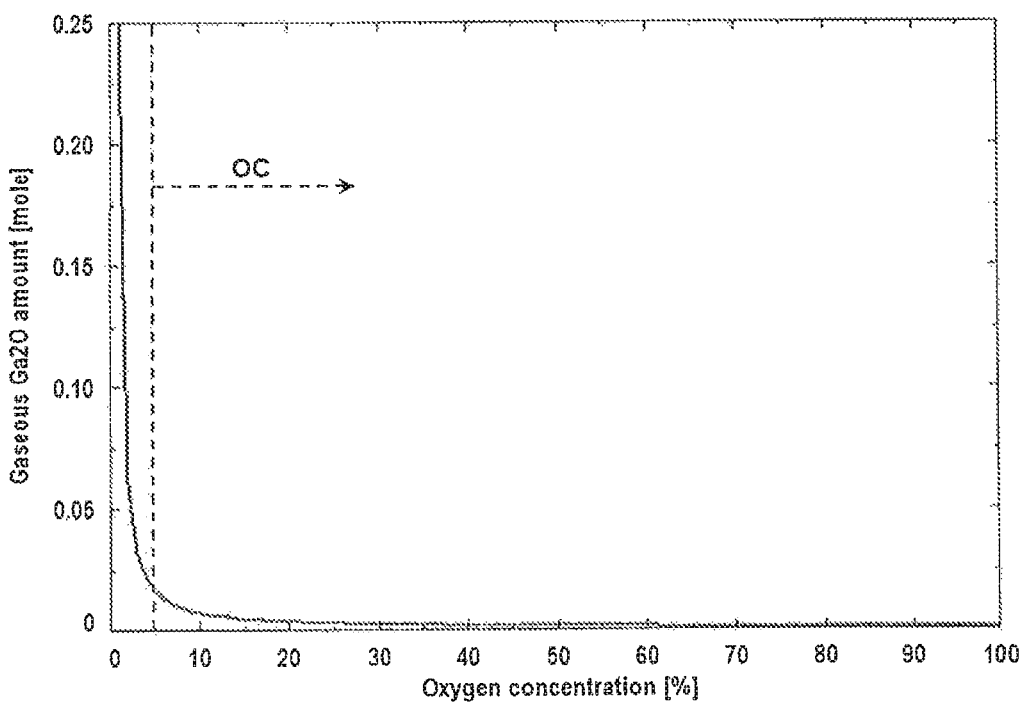

In addition to metallic Ga, decomposition of the $Ga_2O_3$ melt produces a number of volatile species in the gas phase, including oxygen, $Ga_2O$, GaO and Ga, which evaporate to the environment. The most volatile species in addition to oxygen is $Ga_2O$, the amount versus oxygen concentration of which is shown in FIG. 1B. Applying oxygen concentration OC of at least 5 vol. % decreases amount (and fugacity) of $Ga_2O$ by more than one order of magnitude, thus decreases the evaporation of $Ga_2O_3$ during the growth process. Minimizing of $Ga_2O$ evaporation in addition to metallic Ga is crucial to keep the melt more stoichiometric and to stabilize the crystal growth process.

Therefore, by applying the oxygen concentration OC in the range between 5-100 vol. %, the $Ga_2O_3$ melt can be significantly stabilized by minimizing formation of metallic Ga in the $Ga_2O_3$ melt and $Ga_2O$ vapor that evaporates from the melt surface. Thus it is sufficient for both crystal growth stability and iridium (or its alloy) crucible durability. It is to be stressed that such high oxygen concentrations (5-100 vol. %) in connection with the iridium crucible, which is suitable for growing $Ga_2O_3$ single crystals from the melt, has never been reported, mentioned or suggested in the prior art, despite of utilizing iridium crucibles for growing various oxide single crystals for decades.

The essence of the present invention is to apply a very high oxygen concentration (5-100 vol. %) for growing β-$Ga_2O_3$ single crystals from the melt contained within an iridium (or its alloy) crucible around the melting point of $Ga_2O_3$ which is 1820° C., while keeping a relatively low oxygen concentration at low and moderate temperatures, where iridium oxidizes the most and $Ga_2O_3$ decomposition is minor. This strategy is described in FIG. 2A during heating a crystal growth furnace up and growing a β-$Ga_2O_3$ single crystal, and in FIG. 2B during growing the β-$Ga_2O_3$ single crystal and cooling the crystal growth furnace down after the crystal growth process has been completed.

Figure 2A:
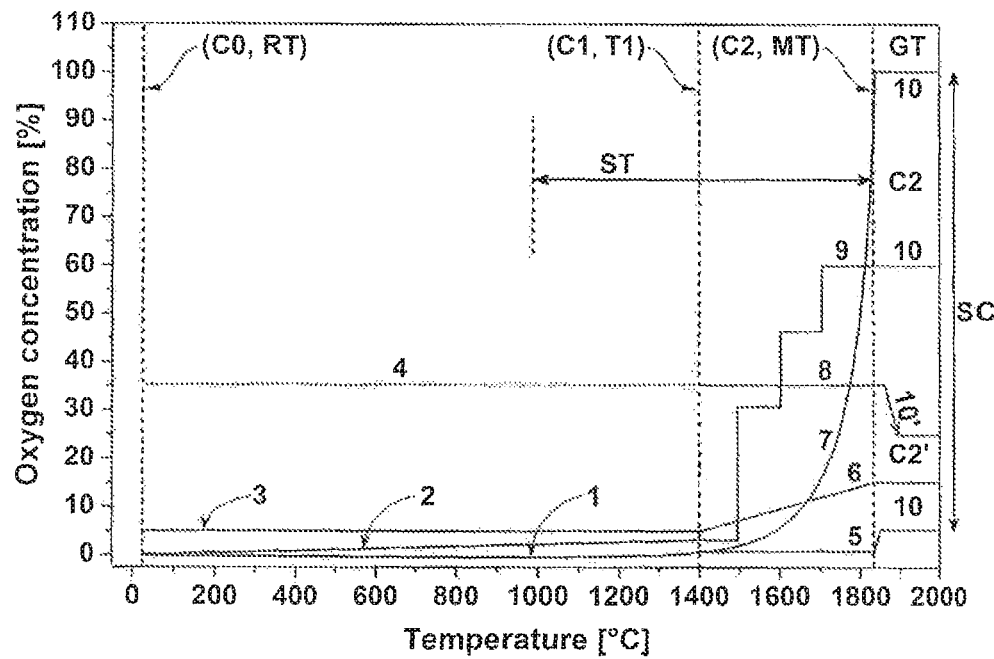
FIGS. 2A and 2B are plots of oxygen concentration in a growth atmosphere vs. temperature during heating up/growth and growth/cooling down steps, which demonstrate the principle of the present invention.

As shown in FIG. 2A, an initial oxygen concentration value C0 is typically small at room temperature RT, usually in the range of 0 to about 3 vol. %. The oxygen concentration OC increases from the initial oxygen concentration value C0 intermediate oxygen concentration value C1 in the temperature range between room temperature RT and an intermediate temperature value T1 in any way, e.g. linearly (profile 1), exponentially (profile 2), asymptotically, in a step-wise manner or in any combination thereof. Although the intermediate temperature value T1 is 1400° C. in this example it may have any value in the temperature range ST between 1000° C. and the melting temperature MT of a $Ga_2O_3$ starting material. This exemplary value of 1400° C. is a compromise between minimizing of the iridium crucible oxidation (which may contaminate a $Ga_2O_3$ starting material) and avoiding $Ga_2O_3$ decomposition during the heating up step. Alternatively, in the temperature range between room temperature RT and the intermediate temperature value T1 the oxygen concentration OC may be constant (i.e. C0=C1) as shown by profiles 3 and 4. Although C0 has typically a small value, in some applications it may have a very high value, such as 35% (profile 4), This is applicable to growth runs with fast heating rates (e.g. 300-500 K/h), when passing through temperatures critical for iridium is very fast. At higher temperatures, i.e. above T1, the $Ga_2O_3$ starting material is more susceptible to decomposition, while iridium oxidation decreases. Therefore the oxygen concentration can be increased to a higher value, i.e. a growth oxygen concentration value C2 around the melting temperature MT of the $Ga_2O_3$ starting material, which is then maintained within an oxygen concentration range SC during the crystal growth step. In this transition region, the oxygen concentration OC can be increased in any way, as shown by different profiles 5 to 9 or any combination thereof. E.g. the oxygen concentration OC can be maintained at substantially low value of C1 to the temperature near or at or just above the melting temperature MT and then it can be abruptly increased to the value C2, as shown by the profile 5. Alternatively, the oxygen concentration OC can be maintained at a high constant value of C1 in the temperature range ST, at the melting temperature MT and during the crystal growth step (C2=C1), as shown by the profile 8. The oxygen concentration OC can be increased in the temperature range ST linearly (profile 6), exponentially (profile 7), in a step-wise manner (profile 9), asymptotically or in any other manner. The way how the oxygen concentration increases or maintains constant is not essential and any profile can be used to achieve the growth oxygen concentration value C2 between 5 and 100 vol. %. The profiles 1-9 are only exemplary and in practice they might be different, due to diffusion processes, relatively large volume of a crystal growth chamber (hundreds of liters), gas flow rates and gas convection (e.g. due to temperature gradients). Also heating time from room temperature RT to the melting temperature MT can be appropriately adapted for the crystal growth method and size of a growth furnace. It can be for example between 5 and 30 h.

According to the present invention it is essential that before melting, during melting or just after melting of the $Ga_2O_3$ starting material the oxygen concentration approaches the growth oxygen concentration value C2 in the oxygen concentration range SC between 5 and 100 vol. % for the reasons explained in connection to FIGS. 1A and 1B. Once all the $Ga_2O_3$ starting material is molten (i.e. at liquid phase), a β-$Ga_2O_3$ single crystal can be grown from the melt at the growth oxygen concentration value C2. The value C2 can be substantially constant at the growth temperature GT during the whole crystal growth step, as shown by profiles 10 in FIGS. 2A and 2B. Alternatively, the growth oxygen concentration value C2 may decrease to a second growth oxygen concentration value C2' at the growth temperature GT as shown by the profile 10' in FIG. 2A. This change always takes place within the oxygen concentration range SC. There are several reasons to decrease oxygen concentration during the crystal growth stage: a) upon melting, during seeding and during early stage of the crystal growth step there is a higher decomposition rate of the exposed melt surface as compared with a later stage of the crystal growth step with much smaller exposed melt surface and lower temperature gradients, where smaller oxygen concentration can be used; b) high oxygen concentration (approximately above 25 vol. %) may lead to a high electrical resistivity of the obtained crystals (this is not a problem when semi-insulating or insulating crystals are required); c) lower oxygen concentration will decrease iridium losses. On the other hand, the oxygen concentration may increase at later stage of the crystal growth step from the growth oxygen concentration value C2 to a third growth oxygen concentration value C2" (as shown by the profile 10" in FIG. 2B) in order to improve the heat transfer through a growing crystal, by lowering the free electron concentration and thus lowering the free carrier absorption in the near infrared spectrum, which becomes more critical with a crystal length. During the crystal growth step both changes can be applied as well. In such case the oxygen concentration OC is decreased from the value C2 to C2' at early stage of the crystal growth step and next increased from the value C2' to C2" at the later stage of the crystal growth step.

It is to be noted that at the liquid-solid interface the melting temperature MT and the growth temperature GT are the same. However, the MT and GT are understood in this description in a broader scope. Due to radial temperature gradients within a metal crucible (e.g. the temperature typically decreases from the crucible wall towards the centre), the melt in the crucible is hotter near the crucible wall than in the centre (e.g. by 50-100 K). Therefore the MT covers all temperatures within the crucible leading to complete melting of the $Ga_2O_3$ starting material. On the other hand, during the crystal growth step the temperature in the melt changes to remove latent heat of crystallization generated due to liquid-solid phase transition being transported through a growing crystal (not present during melting) and to adapt changes in geometry (a drop of a melt level, an increase of a crystal size etc.) in the way to keep constant temperature at the growth interface. Thus, for the purpose of the present description the GT covers all temperature changes in the growth furnace during the crystal growth step.

Figure 2B:
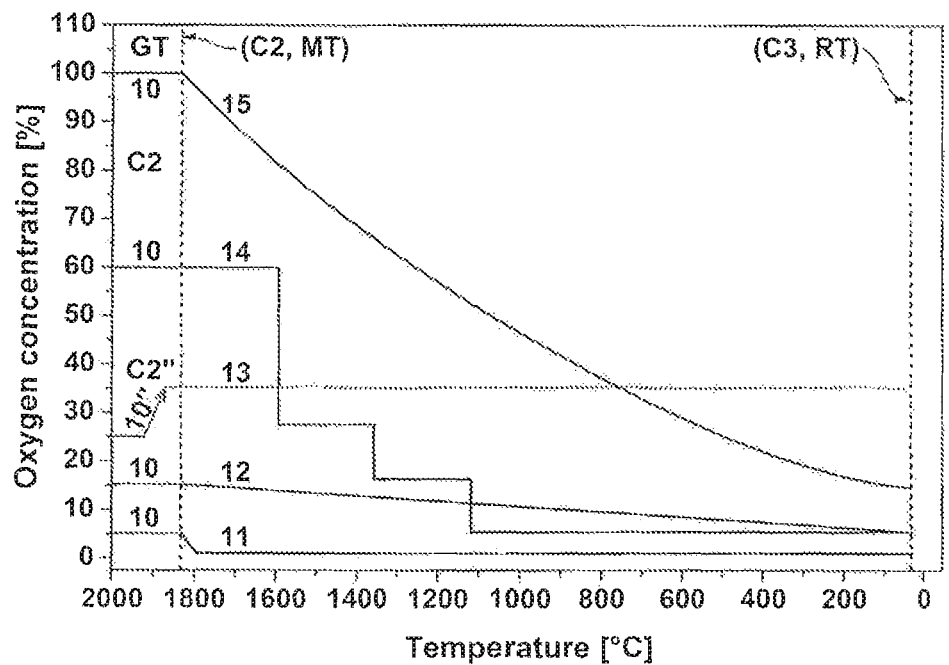

Time period for the crystal growth step mainly depends on the growth method applied, growth rate, crystal length and like, and may last between about one and hundreds of hours. Once the crystal growth step is completed, the growth furnace together with the crystal is cooled down to room temperature RT for a predefined period of time, typically between several and tens of hours, depending on the growth method, furnace and crystal size. During cooling down the oxygen concentration OC decreases from the growth oxygen concentration value C2 to a final oxygen concentration value C3, which is typically lower than the growth oxygen concentration value C2, C2', C2", as shown in FIG. 2B. Because the crystal has already been grown, the oxygen concentration OC at the cooling down step does not need to be changed in such strict manner as during heating up shown in FIG. 2A. The final value C3 does not need to be very small and may exceed 3 vol. %, for example to tune electrical properties of the obtained crystal. However, it is preferable to achieve a small value to avoid high oxidation of iridium at low temperatures during the cooling down step. The oxygen concentration OC can be decreased from the growth oxygen concentration value C2 to the final oxygen concentration value C3 in any way, as shown by profiles 11 to 15 or in any combinations thereof. Alternatively, the final oxygen concentration value C3 may substantially equal to the growth oxygen concentration value C2, C2', C2", as shown by the profile 13 in FIG. 2B.

A defined oxygen concentration OC at different stages of a growth process is provided to a growth furnace within a growth atmosphere surrounding the melt and crystal. The growth atmosphere is composed of oxygen with variable concentration and one or more of other gasses, including Ar, $N_2$, He, Xe, Ne, $CO_2$, CO and traces of $H_2$ or $H_2O$, or any combination thereof. Ar, $N_2$, He, Xe are Ne are neutral gasses, $CO_2$ is an oxidizing agent, while CO, $H_2$ and $H_2O$ are reducing agents to additionally modify electrical properties of a $\beta$-$Ga_2O_3$ single crystal. During early heating up and cooling down steps only $CO_2$ can be used as an oxygen source. Additionally an external overpressure can be used, such as 1-70 bar.

EXAMPLES

Growth Techniques

Now different crystal growth techniques from the melt are exemplary described, which utilize an iridium (or its alloy) crucible and to which the above described invention can be applied to growth $\beta$-$Ga_2O_3$ single crystals or other high melting-point oxides (>1500° C.) requiring a high oxygen concentration, especially those unstable at high temperatures.

Example 1

Figure 3:
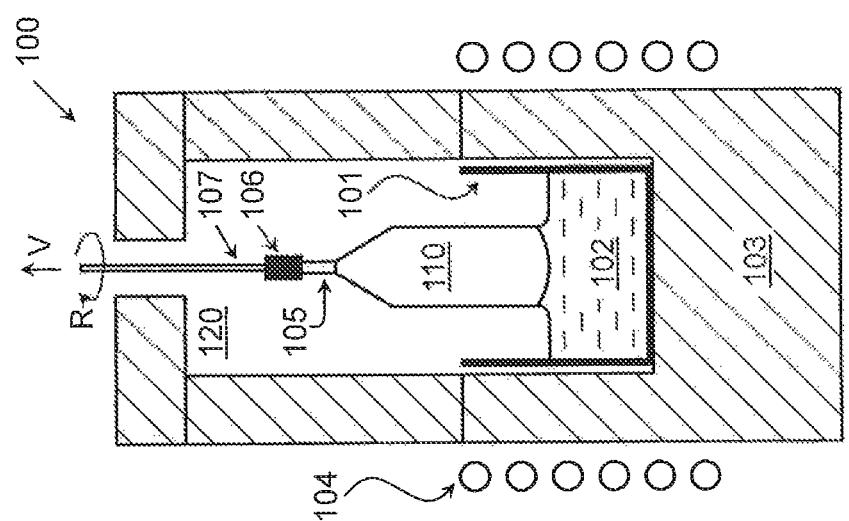
FIG. 3 schematically shows the principle of the Czochralski method to which the present invention can be applied.

FIG. 3 schematically shows a growth furnace 100 of the Czochralski method, which is placed within a water-cooled growth chamber (not shown). The growth furnace 100 includes an iridium crucible 101 containing a $Ga_2O_3$ starting material 102, which is surrounded by a thermal insulation 103. The crucible 101 is heated up by a heater 104, typically an inductive or resistive heater. The heater 104 is connected to a heat generator (not shown) and a controller (not shown). Inside the growth furnace 100 a crystal seed 105 is provided being mounted within a seed holder 106 that is coupled via a pulling rod 107 with a translation and rotation mechanisms (not shown). Inside the growth furnace 100 a growth atmosphere 120 is provided, which is in communication with all furnace parts, including the crucible 101 and the $Ga_2O_3$ starting material 102. During the heating up step, the oxygen concentration contained within the growth atmosphere 120 changes form the initial oxygen concentration value C0 to the intermediate oxygen concentration value C1 (or alternatively C1=C0) and next approaches the growth oxygen concentration value C2 around melting of the $Ga_2O_3$ starting material 102 in the way described in connection to FIG. 2A (or alternatively C2=C1). Once the starting material 102 is molten and stabilized, the crystal seed 105 is brought into a contact with the molten starting material 102 and slowly pulled up with a pulling speed V (e.g. between 0.5-10 mm/h) while rotating with an angular speed R (e.g. at 2-30 rpm). By doing so the melt of the $Ga_2O_3$ starting material 102 solidifies on the crystal seed 105 to form a bulk single crystal 110. A crystal diameter increases from a seed diameter to a predefined cylinder diameter, which is then kept during the rest of the crystal growth step by regulating melt temperature via the controller. During the crystal growth step the oxygen concentration is maintained at the substantially constant level (profile 10) of the growth oxygen concentration value C2. Alternatively, the growth oxygen concentration value C2 can be lowered once the predefined cylinder diameter is achieved (profile 10'). The growth oxygen concentration value C2 can be also increased at a later stage of the crystal growth step (profile 10"). Once a predefined crystal length (or mass) is reached, the crystal 110 is separated from the melt and slowly cooled down. During the cooling down step, the oxygen concentration within the growth atmosphere 120 decreases from the growth oxygen concentration C2 to the final oxygen concentration value C3 (or alternatively C3=C2) in the way described in connection with FIG. 2B.

Example 2

Figure 4:
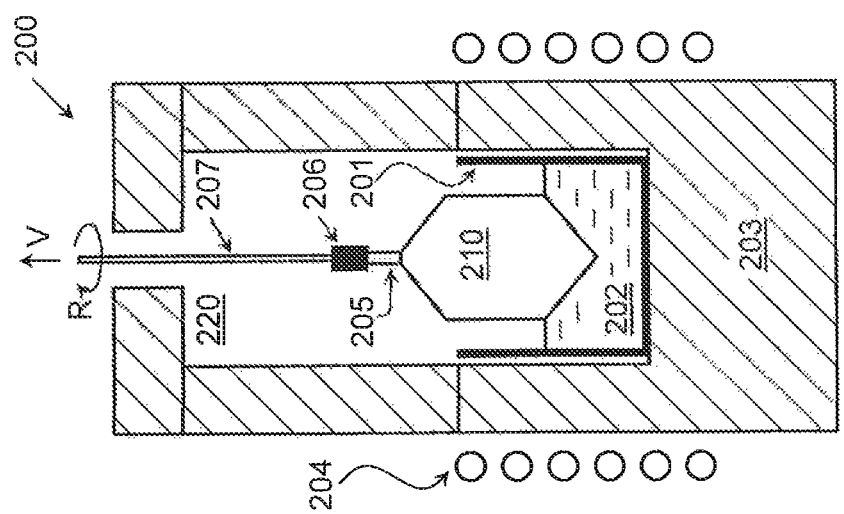
FIG. 4 schematically shows the principle of the Kyropolous method to which the present invention can be applied.

FIG. 4 schematically shows a growth furnace 200 of the Kyropolous method, which is placed within a water-cooled growth chamber (not shown). The Kyropolous method is a variant of the Czochralski method, where a single crystal 210 is rather growing from a larger surface out of the melt and partly within a molten starting material 202. In this method a very small pulling rate V (smaller than that in the Czochralski method) is typically applied, possible with rotation R. All the components of the growth furnace 200 are very similar to those of the Czochralski method (can (can be identical). During the heating up step, the oxygen concentration contained within a growth atmosphere 220 changes form the initial oxygen concentration value. C0 to the intermediate oxygen concentration value C1 (or alternatively C1=C0) and next approaches the growth oxygen concentration value C2 (or alternatively C2=C1) around melting of the $Ga_2O_3$ starting material 202 in the way described in connection to FIG. 2A. During the crystal growth stage the oxygen concentration is maintained at the level of the growth oxygen concentration value C2 or it can be changed during growth within the oxygen concentration range SC (e.g. decreased and/or increased). During the cooling down step, the oxygen concentration within the growth atmosphere 220 decreases from the growth oxygen concentration value C2 to the final oxygen concentration value C3 (or alternatively C3=C2) in the way described in connection with FIG. 2B.

Example 3

Figure 5A:
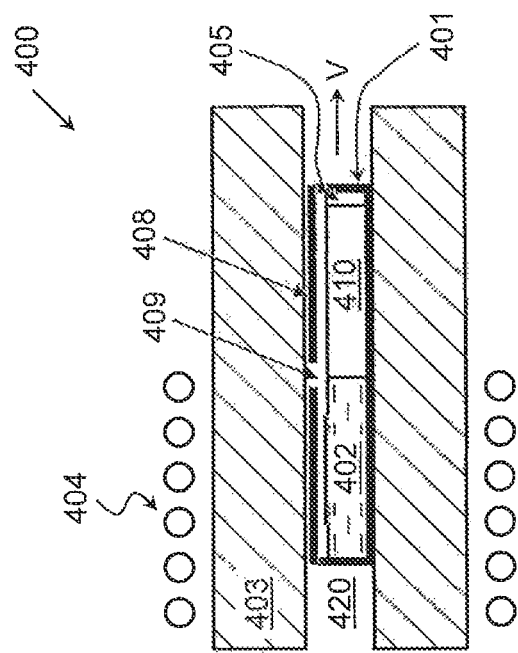
FIGS. 5A and 5B schematically show the principle of the Vertical and Horizontal Bridgman method or Vertical Gradient Freeze method to which the present invention can be applied.

FIG. 5A schematically shows a growth furnace 300 of the Vertical Bridgman method or the Vertical Gradient Freeze method, which is placed within a water-cooled growth chamber (not shown). The growth furnace 300 includes an iridium crucible 301 containing a $Ga_2O_3$ starting material 302, which is surrounded by a thermal insulation 303. The crucible 301 is enclosed by a lid 308, preferably of iridium, with an opening 309 through which a growth atmosphere 320 communicates with the $Ga_2O_3$ starting material 302. The crucible 301 is heated up by a heater 304 (inductive or resistive). The heater 304 is connected to a heat generator (not shown) and a controller (not shown). At the heating up step, the oxygen concentration contained within the growth atmosphere 320 changes form the initial oxygen concentration value C0 to the intermediate oxygen concentration value C1 (or alternatively C1=C0) and next approaches the growth oxygen concentration value C2 (or alternatively C2=C1) around melting of the $Ga_2O_3$ starting material 302 in the way described in connection to FIG. 2A. The bottom part of the crucible 301 is tapered and ended with a small diameter tube that functions as a seed holder 306, within which a crystal seed 305 is accommodated. The iridium crucible 301 is located within vertical temperature gradients in such a way the seed holder 306 along with the crystal seed 305 are hold at lower temperature than the rest of the crucible 301 to prevent melting of the seed 305 once all the $Ga_2O_3$ starting material 302 is molten. The temperature within the crucible 301 typically increases from the seed holder 306 towards the top of the crucible 301. By lowering the temperature at the crucible wall (Vertical Gradient Freeze method) the molten $Ga_2O_3$ starting material 302 slowly solidify on the crystal seed 305 upwards to form a single crystal 310. Instead of lowering the temperature at the crucible wall, the crucible 301 or the whole growth furnace 300 can be lowered in a direction of lower temperatures (Bridgman method) or the heater 304 is moved in a direction opposite to the crystal seed 305. Alternatively both lowering the temperature and moving of the crucible 301/heater 304 can be applied. During the crystal growth step the oxygen concentration is maintained at the level of the growth oxygen concentration value C2 or it can be changed within the oxygen concentration range SC. Once the crystal growth step is completed (i.e. once all the melt is solidified) the growth furnace 300 is cooled down and the oxygen concentration within the growth atmosphere 320 decreases from the growth oxygen concentration value C2 to the final oxygen concentration value C3 (or alternatively C3=C2) in the way described in connection with FIG. 2B.

Example 4

Figure 5B:
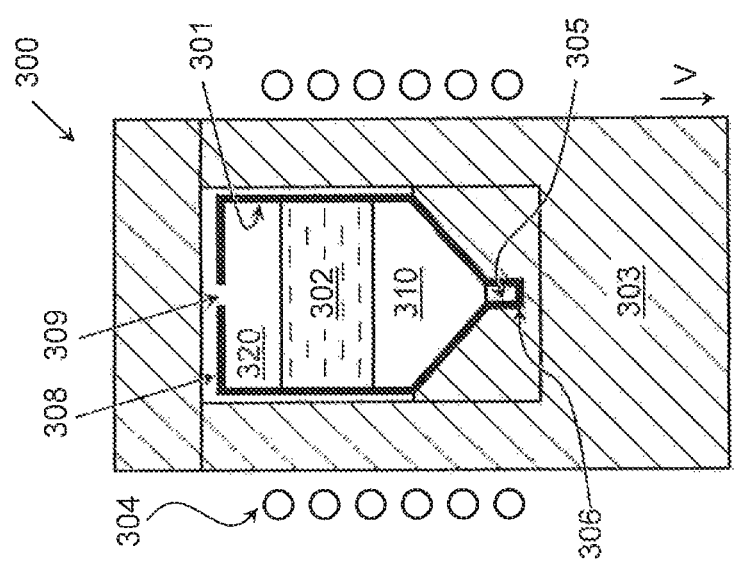

FIG. 5B schematically shows a growth furnace 400 of the Horizontal Bridgman method. The principle of this method is the same as in the case of the Vertical Bridgman method, but the solidification proceeds in a horizontal direction instead of the vertical direction. During the heating up step, the oxygen concentration contained within a growth atmosphere 420 changes form the initial oxygen concentration value C0 to the intermediate oxygen concentration value C1 (or alternatively C1=C0) and next approaches the growth oxygen concentration value C2 (or alternatively C2=C1) around melting of the $Ga_2O_3$ starting material 402 in the way described in connection to FIG. 2A. During the crystal growth step the oxygen concentration is maintained at the level of the growth oxygen concentration value C2 or it can be changed during growth within the oxygen concentration range SC, while during the cooling down step, the oxygen concentration within the growth atmosphere 420 decreases from the growth oxygen concentration value C2 to the final oxygen concentration value C3 (or alternatively C3=C2) in the way described in connection with FIG. 2B.

Example 5

Figure 6:
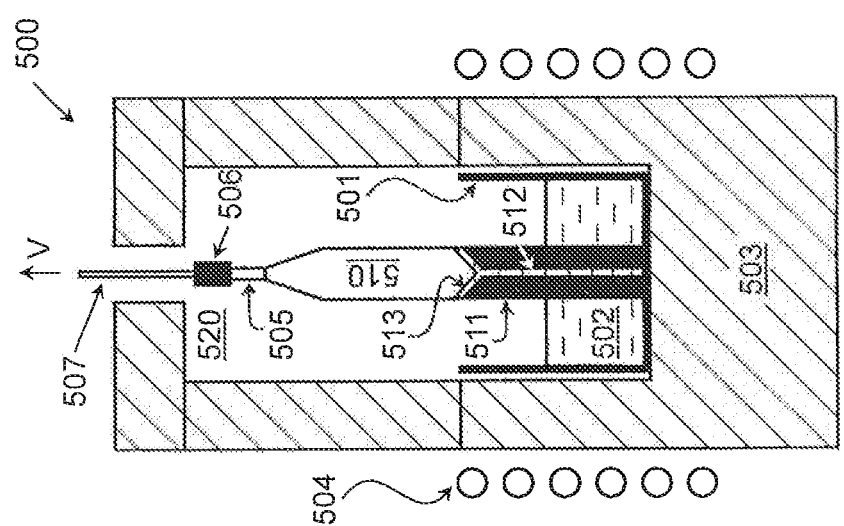
FIG. 6 schematically shows the principle of the shaped crystal growth methods to which the present invention can be applied.

This Example relates to shaped crystal growth techniques in general, such as the Stepanov, Noncapillary Shaping (NCS) and Edge-Defined Film-Fed Growth (EFG) methods. FIG. 6 schematically shows a growth furnace 500 of the EFG method, which is placed within a water-cooled growth chamber (not shown). Within an iridium crucible 501 an iridium die 511 is disposed. The die 511 has at least one opening being in communication with the molten $Ga_2O_3$ starting material 502 and a small-diameter central channel 512, through which the melt is transported via capillary forces (capillary channel) to the top surface 513 having typically a quite small width (several millimeters) but much larger length (even several cm). If the central channel 512 is larger than the capillary constant (noncapillary channel), then the melt is transported through the channel by a pressure difference (Stepanov and NCS methods). Once the $Ga_2O_3$ starting material 502 is molten a crystal seed 505 is brought into the contact with the melt on the top surface 513 and pulled upwards at the pulling speed V to form a single crystal 510. The pulling speed V is typically larger than that of the Czochralski method. A crystal rotation is typically not applied in this method. The resulted crystal shape corresponds to the geometry of the top surface 513 which can be different (e.g. rectangular or circular). Once the crystal growth is completed it is separated from the melt and cooled down. During the heating up step, the oxygen concentration contained within a growth atmosphere 520 changes form the initial oxygen concentration value C0 to the intermediate oxygen concentration value C1 (or alternatively C1=C0) and next approaches the growth oxygen concentration value C2 (or alternatively C2=C1) around melting of the $Ga_2O_3$ starting material 502 in the way described in connection to FIG. 2A. During the crystal growth step the oxygen concentration is maintained at the level of the growth oxygen concentration value C2 or it can be changed during growth within the oxygen concentration range SC, while during the cooling down step, the oxygen concentration within the growth atmosphere 520 decreases from the growth oxygen concentration value C2 to the final oxygen concentration value C3 (or alternatively C3=C2) in the way described in connection with FIG. 2B.

Example 6

Figure 7:
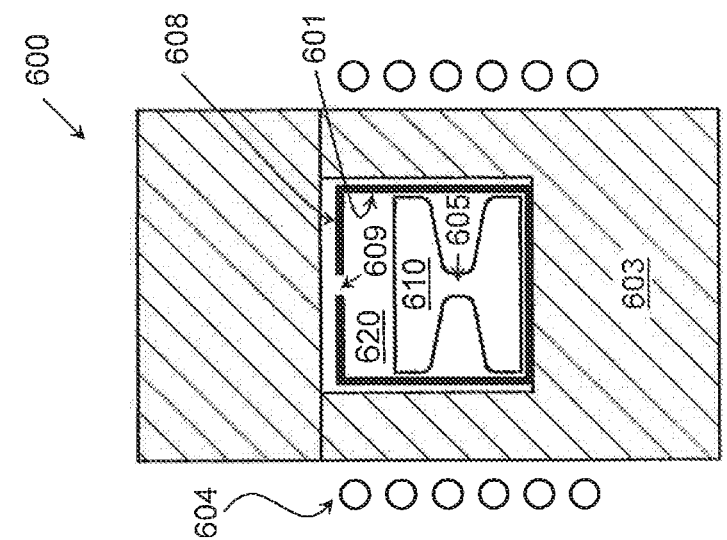
FIG. 7 schematically shows the principle of the Levitation Assisted Self-Seeding Crystal Growth method to which the present invention can be applied.

FIG. 7 schematically shows a growth furnace 600 of the Levitation-Assisted Self-Seeding Crystal Growth Method (LASSCGM), which is placed within a water-cooled growth chamber (not shown). An iridium crucible 601 containing $Ga_2O_3$ starting material 602 is located within a thermal insulation 603. The crucible 601 is covered by a lid 608 with an opening 609 for a communication of a growth atmosphere 620 with the $Ga_2O_3$ starting material 602. A heater 604 must be an inductive heater in this case. In this method it is required that the $Ga_2O_3$ starting material is highly conducting in the liquid phase which is then coupled with the electromagnetic field of the inductive heater 604 through the crucible wall and it is levitated. By levitating a portion of the melt a liquid neck 605 is formed, which acts as a seed during solidification. After melting and levitating a portion of the melt, the furnace 600 is cooled down and the molten $Ga_2O_3$ starting material solidifies on the neck 605 to form two single crystals 610 on the opposite sides of the self-created neck 605. More details of the LASSCGM can be found in document WO 2013/159808 to Galazka et al., which is incorporated here by reference. During the heating up step, the oxygen concentration contained within a growth atmosphere 620 changes form the initial oxygen concentration value C0 to the intermediate oxygen concentration value C1 (or alternatively C1=C0) and next approaches the growth oxygen concentration value C2 (or alternatively C2=C1) at or preferably after melting of the $Ga_2O_3$ starting material 602 in the way described in connection to FIG. 2A. To obtain a high electrical conductivity of the liquid $Ga_2O_3$ starting material 602 the growth oxygen concentration value C2 during the crystal growth step should be kept rather at lower level, e.g. 5-10 vol. %. Additionally an intentional doping with tetravalent ions (Si, Sn) can be used. During the crystal growth step the oxygen concentration is maintained at the level of the growth oxygen concentration value C2 (or alternatively C2=C1), while during the cooling down step, the oxygen concentration within the growth atmosphere 620 decreases from the growth oxygen concentration value C2 to the final oxygen concentration value C3 (or alternatively C3=C2) in the way described in connection with FIG. 2B.

Example 7

In addition to the above-mentioned techniques, the present invention can also be applied to the micro-pulling down technique. This technique involves a small diameter metal (e.g. iridium) crucible with a small diameter aperture at the bottom part, which prevents the starting material to flow out from the crucible after melting by holding it via capillary forces. Then a seed is brought into a contact with the melt in the aperture and pulled down. In this way a crystal fiber of about 1-2 mm in diameter can be grown. During the heating up step, the oxygen concentration contained within a growth atmosphere changes form the initial oxygen concentration value C0 to the intermediate oxygen concentration value C1 (or alternatively C1=C0) and next approaches the growth oxygen concentration value C2 (or alternatively C2=C1) around melting of the $Ga_2O_3$ starting material in the way described in connection to FIG. 2A. During the crystal growth step the oxygen concentration is maintained at the level of the growth oxygen concentration value C2 or it can be changed during the crystal growth step within the oxygen concentration range SC, while during the cooling down step, the oxygen concentration within the growth atmosphere 420 decreases from the growth oxygen concentration value C2 to the final oxygen concentration value C3 (or alternatively C3=C2) in the way described in connection with FIG. 2B. Due to small crucible dimensions, possible fast heating and fast crystal growth rates, oxygen concentration can be as high as 100 vol. % during the entire growth process (i.e. C0=C2=C3=100 vol. %).

EXAMPLES

Oxygen Concentrations

Example 8

Comparative

The Czochralski method 100 (FIG. 3, Example 1) was used with an iridium crucible of 40 mm in diameter and height (the amount of the $Ga_2O_3$ was 1 mole only). The growth atmosphere was $CO_2$ which provided oxygen concentration at the level of about 1.2 vol. % at the melting temperature MT, This means the oxygen concentration was increased from room temperature RT to the melting temperature MT from substantially 0 vol. % to about 1.2 vol. %, which was then kept constant during the crystal growth step at the growth temperature GT. During the cooling down step the oxygen concentration was decreased from 1.2 vol. % at the growth temperature GT to about 0 vol. % at room temperature RT, The obtained crystal was of 20 mm in diameter and 60 mm in length. The crystal quality was relatively good, although contained crystallographic twins and moderate dislocation density. Moreover, the crystal surface was rough as the result of noticeable $Ga_2O_3$ decomposition. Due relatively high $Ga_2O_3$ decomposition the melt was unstable leading to difficulties in seeding and early stage of the crystal growth step. Additionally, some signs of crucible degradation due to eutectic formed between Ga and Ir metals were visible. Similar results were obtained in the case of a growth atmosphere consisting with $O_2$=2 vol. % and $N_2$ 0 98 vol. %. This example demonstrates that relatively good crystals of β-$Ga_2O_3$ could be grown with a very low oxygen concentration if the amount of the staring material was very small (1 mole). In reference to FIG. 1A, the amount of metallic Ga produced during $Ga_2O_3$ decomposition was very small, yet below CR1 curve, therefore not critical at all. However, first sings of problems associated with growth stability, crystal quality and crucible durability have been recognized.

Example 9

Comparative

The Czochralski method 100 (FIG. 3, Example 1) was used with much larger iridium crucible of 100 mm in diameter and height. The growth atmosphere was $CO_2$, identical to that of Example 8. The only difference was much larger iridium crucible and amount of the $Ga_2O_3$ starting material by factor of 18 (18 mole of $Ga_2O_3$). In this case it was almost impossible to start growing a crystal due to a high concentration of metallic Ga being created due to insufficient oxygen concentration in relation to the amount of the $Ga_2O_3$ starting material. The high concentration of metallic Ga changes the melt temperature and the melt chemistry. Even the growth could be eventually started, only a short crystal could obtained (30 mm), although large diameter (50 mm). This was due to high growth instabilities caused by Ga metal. Due to this negative effects the crystal quality was much worse than that of smaller crystal of Example 8. More importantly, usually after a first growth run the crucible was heavily damaged due to eutectic formed between Ga and Ir metals and could not be reused. Crucible damage and lack of a crystal of a reasonable size and quality lead to high economical losses. This example clearly shows that with increasing amount of the $Ga_2O_3$ starting material the oxygen concentration must correspondingly increase to obtain: low level of $Ga_2O_3$ decomposition (i.e. low density of metallic Ga and low evaporation rate), a stable melt flow, much larger crystal size of high structural quality and lower risk of iridium crucible damage.

Example 10

The Czochralski method 100 (FIG. 3, Example 1) was used with an iridium crucible of 100 mm in diameter and height, the same as in Example 9, but a different growth atmosphere was used. During the heating up step, the oxygen concentration was increased from substantially 0 vol. % (the initial oxygen concentration value C0) to about 1 vol. % (the intermediate oxygen concentration value C1) between room temperature RT and the intermediate temperature value T1 of about 1300° C. This was achieved by using $CO_2$ only. Then the $CO_2$ growth atmosphere was replaced with a mixture of Ar=95 vol. %+$O_2$=5 vol. % as the growth atmosphere at and next with Ar=92 vol. %+$O_2$=8 vol. % at the beginning of melting of the $Ga_2O_3$ starting material (the growth oxygen concentration value C2), which was kept constant during the rest of the heating up step until complete melting of the $Ga_2O_3$ starting material (the melting temperature MT) and during the entire crystal growth step at the growth temperature GT. Once the crystal growth step was completed, the growth atmosphere of Ar (92 vol. %)+$O_2$ (8 vol. %) was replaced again with $CO_2$. Oxygen produced during $CO_2$ decomposition was decreased to 0–1 vol. % (the final oxygen concentration value C3) at room temperature RT. As the result only a very small concentration of metallic Ga was present at the melt surface and it was much easier to start growing a crystal. The obtained crystal was a semiconductor with the free electron concentration of $6×10^{17}$ $cm^{-3}$. It was 50 mm in diameter and 125 mm in length, i.e. much longer than that of the comparable Example 9 and of much better structural quality. The crystal was transparent with smooth surface and with no iridium particles therein. Moreover, the iridium crucible has not been damaged by Ga—Ir eutectic and it could be re-used several times.

Example 11

This Example is very similar to that of Example 10 (the Czochralski method 100, iridium crucible of 100 mm in diameter and height), but a different oxygen concentration was used. The initial oxygen concentration value C0 was about 0 vol. %, which was increased during the heating up step to about 1.1 vol. % (the intermediate oxygen concentration value C1) at about 1700° C. (the intermediate temperature value T1). This was achieved by using a $CO_2$ growth atmosphere. Then the oxygen concentration was increased to 12 vol. % (the growth oxygen concentration value C2) at the beginning of melting of $Ga_2O_3$ (the melting temperature MT), by replacing the $CO_2$ growth atmosphere with a mixture of Ar=88 vol. %+$O_2$=12 vol. % as the growth atmosphere. The growth oxygen concentration value C2 of 12 vol. % was kept constant during the entire crystal growth step at the growth temperature GT. During the cooling down step, the oxygen concentration was decreased to 0–1 vol. % (the final oxygen concentration value C3) at room temperature RT. The metallic Ga concentration was still lower than that in Example 9 and there was quite easy to initiate crystal seeding and growth. The obtained crystal was a semiconductor with the free electron concentration of $2=10^{17}$ $cm^{-3}$, which was lower than that in Example 10 due to higher oxygen concentration. The crystal was 50 mm in diameter and 100 mm in length. It was transparent with a very smooth surface. The overall crystal quality was much better as compared with a crystal grown under low oxygen concentration (comparative Example 9). No iridium particles were present inside the crystal and no damage sings of the crucible were visible.

Example 12

This Example is very similar to Examples 10 and 11 (the Czochralski method 100 with 100 mm iridium crucible). The initial oxygen concentration value C0 was about 0 vol. % which was next increased to the intermediate oxygen concentration value C1 of about 1 vol. % at about 1500° C. (the intermediate temperature value T1), and then to the growth oxygen concentration value C2 of 20 vol. % just below the melting temperature MT. Similar to Example 11, initially $CO_2$ was used as the growth atmosphere, which was then replaced with a mixture of Ar=80 vol. %+$O_2$=20 vol. % as the growth atmosphere. The growth oxygen concentration value C2 of 20 vol. % was kept constant during the entire crystal growth step at the growth temperature GT. During the cooling down step, the oxygen concentration was decreased from the growth oxygen concentration value C2 of 20 vol. % to the final oxygen concentration value C3 of 0–1 vol. % at room temperature RT. This was achieved by replacing the Ar+$O_2$ growth atmosphere with the $CO_2$ growth atmosphere during the cooling down step. The obtained crystal was a semiconductor with the free electron concentration of $7×10^{16}$ $cm^{-3}$, which was lower than that in Examples 10 and 11 due to yet higher oxygen concentration.

The results in terms of the crystal size, appearance and quality, as well as crucible stability were similar to those of Example 10 and 11.

Example 13

This Example is similar to Example 8 (the Czochralski method 100), but a different growth atmosphere was used. The crucible diameter and height were 40 mm. Additionally the $Ga_2O_3$ starting material was doped with Mg at a very low level of 0.05 mol. %. The initial oxygen concentration value C0 at room temperature RT was about 0 vol. % which was next increased to the intermediate oxygen concentration value C1 of about 1 vol. % (by using $CO_2$) at the intermediate temperature value T1 of 1460° C., and then to the growth oxygen concentration value C2 of 35 vol. % by using a mixture of $N_2$=65 vol. %+$O_2$=35 vol. % as the growth atmosphere at temperature below the melting temperature MT, which was then kept constant during the entire crystal growth step at the growth temperature GT. Oxygen concentration changes during the heating up step were step-wise (oxygen was increased in steps of about 5 vol. % in temperature intervals of about 50-100 K by changing a $N_2/O_2$ ratio). During the cooling down step, the oxygen concentration was decreased from the growth oxygen concentration value C2 of 35 vol. % at growth temperature GT to the final oxygen concentration value C3 of about 1 vol. % at room temperature RT in the step-wise manner by changing the $N_2/O_2$ ratio. The obtained crystal of 20 mm in diameter and 60 mm in length was an electrical insulator. The structural quality of the crystal was as good as that in Examples 10-12.

Example 14

This Example is similar to the Example 13 (the Czochralski method 100), but a different growth atmosphere was used. The crucible diameter and height were 40 mm. The initial oxygen concentration value C0 at room temperature RT was 3 vol. % (a mixture of Ar=97 vol. %+$O_2$=3 vol. %) which was kept constant as the intermediate oxygen concentration value C1 (C1=C0) until the intermediate temperature value T1 of 1820° C. which is equal to the melting temperature MT (T1=MT), that is when the all $Ga_2O_3$ starting material was in the liquid phase. Next the oxygen concentration at the melting temperature MT was abruptly increased from the intermediate oxygen concentration value C1 to the growth oxygen concentration value C2 of 12.5 vol. % by an increase of the $O_2$ flow with respect to the Ar flow. The growth oxygen concentration value C2 was kept constant at the growth temperature GT during seeding, growth of the crystal shoulder and the beginning of the crystal cylinder. Next the growth oxygen concentration value C2 was decreased (as shown by the profile 10' in FIG. 2A) to a second growth oxygen concentration value C2' of 9.7 vol. % (C1'<C2), which was kept constant during growth of most of the crystal cylinder. When the crystal cylinder achieved of about ⅔ of the final length, the second growth oxygen concentration value C2' was increased (as shown by the profile 10" in FIG. 2B) to a third growth oxygen concentration value C2" of 13.8 vol. % (C2">C2). During the cooling down step, just after the crystal growth step was completed, the growth atmosphere consisting of Ar+$O_2$ was replaced with $CO_2$, and the final oxygen concentration value C3 was 0-1 vol. % at room temperature RT. The obtained crystal 20 mm in diameter and 60 mm in length was a semiconductor with the free electron concentration of $6\times10^{17}$ $cm^{-3}$. Other features were very similar to those in previous Examples 10-13.

Example 15

In this Example the Kyropoluos method 200 was utilized, as schematically shown in FIG. 4. The iridium crucible diameter and height were 40 mm. The initial oxygen concentration value C0 was about 0 vol. % at room temperature RT, which was next increased to the intermediate oxygen concentration value C1 of about 1.1% (from $CO_2$) at the intermediate temperature value T1 of 1630° C., and then to the growth oxygen concentration value C2 of 16 vol. % just below the melting temperature MT. This was Obtained by replacing $CO_2$ with a mixture of $N_2$=84 vol. %+$O_2$=16 vol. %. The growth oxygen concentration value C2 of 16 vol. % was kept constant during the initial stage of crystal growth at the growth temperature GT. Once the initial stage of crystal growth was completed (seeding and crystal shoulder), the growth oxygen concentration value C2 of 16 vol. % was decreased to a second oxygen concentration value C2' of 8%, which was kept constant to the end of the crystal growth step at the growth temperature GT. The final oxygen concentration value C3 at room temperature RT was 3 vol. %, obtained by a decrease (from the growth oxygen concentration value C2 in a step-wise manner) of the $O_2$ flow in relation to the $N_2$ flow. The resulted crystal was of 32 mm in diameter and 20 mm in length. Similar to the above-described Examples 9-14, the obtained crystal was a transparent semiconductor with the free electron concentration of $1\times10^{17}$ $cm^{-3}$ and high structural quality. No signs of a crucible damage were observed.

Example 16

In this example the Vertical Bridgman or VGF method 300 was utilized as schematically shown in FIG. 5A. The cylindrical part of the crucible was of 60 mm and 80 mm in diameter and length, respectively. The bottom conical part of the crucible of 25 mm in length was ended with a 5 mm tube acting as a seed holder. In this experiment Sn (0.1 mol % of $SnO_2$ in the $Ga_2O_3$ starting material) was used as an intentional dopant to obtain high electrical conductivity of the obtained crystal despite of a very high oxygen concentration. The initial oxygen concentration value C0 was 0 vol. % at room temperature RT, which was then increased to the intermediate oxygen concentration value C1 of about 1 vol. % (from the $CO_2$ growth atmosphere) at the intermediate temperature value T1 of 1430° C. During the next stage of the heating up step the intermediate oxygen concentration value C1 of 1 vol. % was increased to the growth oxygen concentration value C2 of 17 vol. % (by replacing $CO_2$ with a mixture of $N_2$=83 vol. %+$O_2$=17 vol %) below the melting temperature MT. The value C2 of 17 vol. % was kept constant during melting and during the crystal growth step at the growth temperature GT. Once the crystal growth step was completed and after an initial stage of the cooling down step, the growth oxygen concentration value C2 was decreased during the next stage of the cooling down step to the final oxygen concentration value C3 of about 0-1 vol. % (by replacing $N_2+O_2$ with $CO_2$) at room temperature RT. The obtained crystal was 50 mm in diameter and 35 mm long. It was a transparent semiconductor with the free electron concentration of $5\times10^{18}$ $cm^{-3}$. No signs of crucible damage was observed.

Example 17

In this example two shaped crystal growth techniques were used: the NCS and EFG methods 500, as schematically shown in FIG. 6. The cylindrical iridium crucible diameter and height were 40 mm. The die was made of iridium and had a conically-shaped circular top surface of 16 mm to obtain a cylindrical crystal of the same diameter. The central channel 512 was of 12 mm in diameter in the case of the NCS variant and 1 mm in diameter in the case of the EFG variant. The initial oxygen concentration value C0 was about 0% at room temperature RT, which was next increased to the intermediate oxygen concentration value C1 of 1% (from $CO_2$) at the intermediate temperature value T1 of 1400° C., and then to the growth oxygen concentration value C2 of 12% just below the melting temperature MT. This was obtained by replacing $CO_2$ with a mixture of Ar=88 vol. %+$O_2$=12 vol. %. The growth oxygen concentration value C2 of 12% was kept constant during the entire crystal growth step at the growth temperature GT. The final oxygen concentration value C3 at room temperature RT was about 0-1 vol. %, obtained by replacing $N_2$+$O_2$ with $CO_2$. The resulted single crystals were semiconductors of 16 mm in diameter and 50 mm in length. No iridium crucible and die damage was observed.

Example 18

In this example the Levitation-Assisted Self-Seeding Crystal Growth Method 600 was utilized as schematically shown in FIG. 7. The iridium crucible was of 40 mm in diameter and height. To obtain a very high electrical conductivity of $Ga_2O_3$ in the liquid phase an intentional doping with Sn (0.2 mol % of $SnO_2$ in the $Ga_2O_3$ starting material) was used. The initial oxygen concentration value C0 was 2 vol. % at room temperature RT, which was kept constant to the intermediate temperature value T1 of 1500° C., that is C1=C0. Next, the intermediate oxygen concentration value C1 of 2 vol. % (a mixture of $N_2$=98 vol. %+$O_2$=2 vol. %) was increased to the growth oxygen concentration value C2 of 5 vol. % (by an increase of the $O_2$ flow with respect to the $N_2$ flow) below the melting temperature MT. The value C2 of 5 vol. % was kept constant during melting and during the crystal growth step at the growth temperature GT. Once the crystal growth step was completed and after the initial stage of the cooling down step, the growth oxygen concentration value C2 was decreased during the next stage of the cooling down step to the final oxygen concentration value C3 of about 1 vol. % (by a decrease of the $O_2$ flow with respect to the $N_2$ flow) at room temperature RT. The obtained crystal was 35 mm in diameter and 20 mm long with relatively good structural quality. It was a transparent semiconductor with the free electron concentration of $1 \times 10^{19}$ $cm^{-3}$. No signs of a crucible damage was observed.

The growth atmosphere in addition to main constituents ($O_2$, $CO_2$, $N_2$, Ar) and depending on a growth process contained also other gases, such as $H_2O$ between 0-1.5 vol. %, $H_2$ between 0-0.1 vol. %, CO between 0-2 vol, % (mainly from $CO_2$ decomposition) and He between 0-100 vol. ppm. Typically the growth atmosphere contained several gases, especially in the case of replacing one atmosphere with another one.

Using the growth atmosphere according to the teaching of the present invention significantly decreases eutectic formation between solid iridium crucible and metallic gallium formed during decomposition of $Ga_2O_3$. This is of particular importance when using large growth systems to obtain large single crystals of several kg by weight (e.g. cylindrical crystals of 2-4 inch in diameter grown by the Czochralski method), what is required at the industrial level. At the same time also evaporation of volatile species of $Ga_2O_3$ have been minimized or eliminated. Secondly, the obtained crystals, whether small or large, were of high structural quality when using the inventive growth atmosphere. The full with of half maximum (FWHM) of the rocking curve (determining structural quality) was around or below 50 arcsec when using the novel growth atmosphere indicating an improvement by factor of two or three when compared with crystals grown at low oxygen concentration (around 100-150 arcsec). Furthermore, the crystals obtained under the novel growth atmosphere had lower dislocation density (not exceeding several thousand per $cm^2$) by factor of 10-100 as compared with the crystals grown with use of the atmosphere containing lower oxygen concentration. Moreover, the inventive growth atmosphere minimized or even eliminated crystallographic twinning, cleaving and cracking. Also the crystal surface became smooth and shiny as the decomposition of $Ga_2O_3$ was significantly reduced. In additions to much improved crystal quality, high oxygen concentration at liquid $Ga_2O_3$ contained within a metal crucible allowed for much easier seeding and more stable crystal growth process. A combination of the above-mentioned advantages of the present inventions led to a high overall production yield of the crystals (a combination of crystal size and quality as well as extended life of an iridium crucible). Yet another advantage of the present invention is the possibility of modifying electrical and optical properties of the crystals by using different oxygen concentrations during the growth and/or cooling down steps. For example, crystals grown at very high oxygen concentrations (>2.5 vol %) my turn into semi-insulating or insulating state, while at lower values of the oxygen concentration the crystals remain semiconducting. Therefore depending on needs the crystals can be grown either as insulators, semi-insulators or semiconductors, with yet different electrical properties.

Unexpectedly and surprisingly, the obtained crystals did not contained any iridium particles, in contrast to low oxygen concentrations, when iridium particles are often present in the obtained crystals. This is due to very high iridium oxide partial pressure at high temperatures, which evaporates very effectively just after creation. If high oxygen concentration is used at moderate temperatures (600-1000° C.), then iridium oxide partial pressure is very low and may simple contaminate the starting material contacting the iridium crucible. Despite of extremely high oxygen concentration according to the present invention (up to 100 vol. %) at high temperatures iridium losses due to oxidation and evaporation are quite low and acceptable, between 2-9 wt. % per growth run depending on oxygen concentration and duration of the growth run. In the case of 100 vol. % of oxygen, 9 wt. % of iridium loss relates to one-day growth run, while at lower oxygen concentrations several wt. % of iridium loss relates to several-day grow runs.

The present invention can be applied for obtaining β-$Ga_2O_3$ single crystals which are either undoped or intentionally doped with a number of elements to further modify (if needed), in addition to oxygen concentration, electrical and optical properties of the crystals. Some of the crystals described in reference to Examples 10-18 were undoped, while other ones were doped either with divalent ions (Mg) to obtained insulating crystals or tetravalent ions (Sn) to increase the electrical conductivity of the crystals despite of high oxygen concentration. In connection to the inventive growth atmosphere any dopants can be used, as required.

The crystal growth atmosphere according to the present invention has a very broad spectrum of applications, as it can be applied to any crystal growth method utilizing a metal crucible comprising iridium or its alloys. These methods have been described in connection with Examples 1-18 and FIGS. 3-7. Any modifications or adaptations of these methods are also encompassed, as long as a metal crucible is used at high temperatures (>1500° C.).

High structural quality of the obtained $\beta$-$Ga_2O_3$ crystals allows for fabrication of high quality wafers or substrates for depositing thereon homo- or heteroepitaxial films or layers with use of various epitaxial techniques. Homoepitaxial films or layers may include $\beta$-$Ga_2O_3$ single crystal films of different conductivity than the substrate, while heteroepitaxial films involve other compounds, such as different oxides or nitrides (GaN, AlN, AlGaN, InN, InGaN and like). The epitaxial techniques include, but not limited to Molecular Beam Epitaxy (MBE), Metal-Organic Chemical Vapor Deposition (MOCVD), Pulsed Laser deposition (PLD), Sputtering, Electron Beam Evaporation and like. Wafers or substrates prepared from $\beta$-$Ga_2O_3$ single crystals can also be used as seeds for other growth techniques, such as, but not limited to Chemical Vapor Transport (CVT), Physical Vapor Transport (PVT) and like.

$\beta$-$Ga_2O_3$ single crystals according to the present invention can be used in a diversity of applications, such as, but not limited to: light emitting diodes, solid-state lasers, transparent or high power field-effect transistors (such as MISFET and MOSFET), Schottky diodes and high temperature gas sensors (electrical properties change on oxidizing and reducing conditions at elevated temperatures).

The essence of the present invention is the use of a very high oxygen concentration (5-100 vol. %) in connection with an iridium crucible (or its alloys) at high temperatures (>1500° C.). This is a general finding, which can be applied to any oxide crystals grown from the melt contained within the iridium crucible and which require high oxygen concentrations. In particular the present invention is suitable for other transparent conducting or semiconducting oxides, which are thermally unstable and require high oxygen partial pressure or concentration. Examples of such oxides include, but not limited to ZnO, $In_2O_3$, NiO, $SnO_2$, $BaSnO_3$, their compounds and like. The inventive growth atmosphere is also suitable for other groups of electronic and optical oxide single crystals, such as, but not limited to: scintillators, laser materials (including second harmonic generation), piezoelectrics etc.

It is important to note that the operating conditions, arrangement and design of the methods as shown in the various embodiments are illustrative only. Although only exemplary embodiments of the present invention have been described in detail in this disclosure, those skilled in the art will readily appreciate that many modifications are possible, e.g., variations in values of crystal growth parameters, crystal growth atmosphere compositions, use of materials, use of crystal growth techniques, process designs etc. without materially departing from the novel teachings and advantages of the subject matter recited in the claims. Accordingly, all such modifications are intended to be included within the scope of the present invention as defined in the appended claims. Other substitutions, modifications, changes and omissions may be made in the operating conditions and arrangement of the preferred and other exemplary embodiments without departing from the scope of the present inventions.

REFERENCE NUMERAL LIST 1-9 Oxygen concentration profiles vs. temperature during heating up step
10, 10', 10" Oxygen concentration profiles during crystal growth step
11-15 Oxygen concentration profiles vs. temperature during cooling down step
100, 200, 300, 400, 500, 600 Crystal growth furnace
101, 201, 301, 401, 501, 601 Metal crucible
102, 202, 302, 402, 502, 602 $Ga_2O_3$ starting material
103, 203, 303, 403, 503, 603 Thermal insulation
104, 204, 304, 404, 504, 604 Heater
105, 205, 305, 405, 505, 605 Crystal seed
106, 206, 306, 406, 506 Seed holder
107, 207, 507 Pulling rod
110, 210, 310, 410, 510, 610 Single crystal
120, 220, 320, 420, 520, 620 Growth atmosphere
308, 408, 608 Lid covering the crucible 301, 401, 601
309, 409, 609 Opening in the lid 308, 408, 308
511 Die of the metal crucible 501
512 Central channel of the die 511
513 Top surface of the die 511
OC Oxygen concentration
C0, C1, C2, C2', C2", C3 Oxygen concentration values: initial, intermediate, growth and final
T1 Intermediate temperature value
ST Range of temperature values T1
SC Range of oxygen concentrations at the growth temperature
MT Melting temperature
GT Growth temperature
RT Room temperature
V Pulling speed
R Rotation rate

The invention claimed is:

1. A method for growing beta phase of gallium oxide ($\beta$-$Ga_2O_3$) single crystals from a melt contained within a metal crucible, comprising the steps of:
providing into a growth chamber a thermal system or growth furnace (100, 200, 300, 400, 500, 600) comprising the metal crucible (101, 201, 301, 401, 501, 601) containing the $Ga_2O_3$ starting material (102, 202, 302, 402, 502, 602), a thermal insulation (103, 203, 303, 403, 503, 603) surrounding the metal crucible (101, 201, 301, 401, 501, 601) and a heater (104, 204, 304, 404, 504, 604) disposed around the metal crucible (101, 201, 301, 401, 501, 601);
providing or creating a crystal seed (105, 205, 305, 405, 505, 605) within the growth furnace (100, 200, 300, 400, 500, 600);
introducing at least into the growth furnace (100, 200, 300, 400, 500, 600) a growth atmosphere (120, 220, 320, 420, 520, 620) containing oxygen;
heating up the metal crucible (101, 201, 301, 401, 501, 601) by the heater (104, 204, 304, 404, 504, 604), which in turns heats up the $Ga_2O_3$ starting material (102, 202, 302, 402, 502, 602) until melting;
contacting the crystal seed (105, 205, 305, 405, 505, 605) with the molten $Ga_2O_3$ starting material (102, 202, 302, 402, 502, 602) contained within the metal crucible (101, 201, 301, 401, 501, 601);
growing a $\beta$-$Ga_2O_3$ single crystal (110, 210, 310, 410, 510, 610) on the crystal seed (105, 205, 305, 405, 505, 605) by temperature gradients between the crystal seed and the melt;
cooling down the grown $\beta$-$Ga_2O_3$ single crystal (110, 210, 310, 410, 510, 610) to room temperature (RT) once the crystal growth step has been completed;
characterized in that it further comprises the steps of:

i) providing into the growth furnace (100, 200, 300, 400, 500, 600) the growth atmosphere (120, 220, 320, 420, 520, 620) consisting of a mixture of pure oxygen and at least one non-reducing gas selected from the group consisting of Ar, $N_2$, He Xe, Ne, and $CO_2$, with a variable oxygen concentration (OC) or partial pressure at substantially atmospheric pressure in such a way that the oxygen concentration (OC) reaches a growth oxygen concentration value (C2, C2', C2") in the concentration range (SC) of 5-100 vol. % below (8, 9) the melting temperature (MT) of $Ga_2O_3$ or at (6, 7) the melting temperature (MP) or after (5) complete melting of the $Ga_2O_3$ starting material (102, 202, 302, 402, 502, 602) adapted to minimize creation of metallic gallium amount (CR1, CR2, CR3) and thus eutectic formation with the metal crucible (101, 201, 301, 401, 501, 601) and to improve stoichiometry of the $Ga_2O_3$ starting material (102, 202, 302, 402, 502, 602) and crystal growth stability; and ii) maintaining the growth oxygen concentration value (C2, C2', C2") within the oxygen concentration range (SC) during the crystal growth step of the β-$Ga_2O_3$ single crystal (110, 210, 310, 410, 510, 610) from the melt at the growth temperature (GT).

2. The method according to claim 1, wherein the oxygen concentration (OC):

iii) does not exceed an intermediate oxygen concentration value (C1) in the range of 0-5 vol. % during the heating up step from room temperature (RT) to an intermediate temperature value (T1), intermediate temperature value (T1) being located within the temperature range (ST) between 1000° C. and the melting temperature (MT) of $Ga_2O_3$;

iv) increases from the intermediate oxygen concentration value (C1) to the growth oxygen concentration value (C2, C2', C2") in the oxygen concentration range (SC) of 5-100 vol. % during the heating up step from the intermediate temperature value (T1) to the melting temperature (MT) of $Ga_2O_3$ or at the melting temperature (MT) or after complete melting of the $Ga_2O_3$ starting material (102, 202, 302, 402, 502, 602) if the intermediate temperature value (T1) substantially equals to the melting temperature (MT).

3. The method according to claim 1, wherein the oxygen concentration (OC):

v) decreases from the growth oxygen concentration value (C2, C2', C2") to a final oxygen concentration value (C3) being lower than the growth oxygen concentration value (C2, C2', C2") during the cooling down step from the growth temperature (GT) to room temperature (RT).

4. The method according to claim 1, wherein the growth oxygen concentration value (C2) is substantially constant (10) within the oxygen concentration range (SC) at the growth temperature (GT) during the entire crystal growth step.

5. The method according to claim 1, wherein the growth oxygen concentration value (C2) decreases (10') to a second growth oxygen concentration value (C2') within the oxygen concentration range (SC) at the growth temperature (GT) after an early stage of the crystal growth step.

6. The method according to claim 1, wherein the growth oxygen concentration value (C2) increases (10") to a third growth oxygen concentration value (C2") within the oxygen concentration range (SC) at the growth temperature (GT) at the later stage of the crystal growth step.

7. The method according to claim 1, wherein the growth oxygen concentration value (C2) first decreases (10') to a second growth oxygen concentration value (C2') within the oxygen concentration range (SC) at the growth temperature (GT) after an early stage of the crystal growth step, and increases (10") to a third growth oxygen concentration value (C2") within the oxygen concentration range (SC) at the growth temperature (GT) at the later stage of the crystal growth step.

8. The method according to claim 1, wherein the growth atmosphere (120, 220, 320, 420, 520, 620) contains in addition to oxygen traces of $H_2$ and/or $H_2O$ to modify electrical properties of the β-$Ga_2O_3$ single crystals.

9. The method according to claim 1, wherein the growth atmosphere (120) is applied to the Czochralski method (100).

10. The method according to claim 1, wherein the growth atmosphere (220) is applied to the Kyropolous method (200).

11. The method according to claim 1, wherein the growth atmosphere (320) is applied to the vertical Bridgman or Vertical Gradient Freeze method (300).

12. The method according to claim 1, wherein the growth atmosphere (420) is applied to the horizontal Bridgman method (400).

13. The method according to claim 1, wherein the growth atmosphere (520) is applied to shaped crystal growth techniques selected from the group consisting of the Stepanov, Noncapillary Shaping and Edge-Defined Film-Fed Growth methods (500).

14. The method according to claim 1, wherein the growth atmosphere (620) is applied to the Levitation Assisted Self-Seeding Crystal Growth method (600).

15. The method according to claim 1, wherein the growth atmosphere is applied to the Micro-Pulling Down method.

* * * * *